United States Patent [19]
Booher

[11] 4,091,461
[45] May 23, 1978

[54] HIGH-SPEED MEMORY CELL WITH DUAL PURPOSE DATA BUS

[75] Inventor: Robert K. Booher, Mission Viejo, Calif.

[73] Assignee: Rockwell International Corporation, El Segundo, Calif.

[21] Appl. No.: 656,776

[22] Filed: Feb. 9, 1976

[51] Int. Cl.² .................. G11C 7/00; G11C 11/40
[52] U.S. Cl. .................. 365/154; 307/238; 307/279; 365/190; 365/222
[58] Field of Search .............. 340/173 FF; 307/238, 307/279, 292

[56] References Cited

U.S. PATENT DOCUMENTS

| | | | |
|---|---|---|---|
| 3,564,300 | 2/1971 | Henle | 307/279 X |
| 3,573,485 | 4/1971 | Ballard | 340/173 FF |
| 3,686,645 | 9/1972 | Brojdo | 340/173 FF |
| 3,849,675 | 11/1974 | Waaben | 340/173 FF |
| 3,949,383 | 4/1976 | Askin et al. | 340/173 FF |
| 3,949,385 | 4/1976 | Sonoda | 340/173 FF |

OTHER PUBLICATIONS

"Sapphire Brings Out The Best In C-Mos", by S. Sheffield Eaton, Electronics/June 12, 1975, pp. 115–118.

Primary Examiner—Stuart N. Hecker
Assistant Examiner—Donald McElheny
Attorney, Agent, or Firm—H. Fredrick Hamann; G. Donald Weber, Jr.; Morland C. Fischer

[57] ABSTRACT

An improved memory cell for minimizing space consumption and cost of production. A two-rail data bus line configuration is shared for the dual purpose of reading and writing binary information or for powering the memory cell. The memory cell is rendered in a dynamic condition for reading or writing binary information via the data bus lines. At all other times, the memory cell is rendered in a static or holding condition during which time the data nodes of the cell are connected to a source of reference potential and the memory cell is powered.

13 Claims, 5 Drawing Figures

HIGH-SPEED MEMORY CELL WITH DUAL PURPOSE DATA BUS

BACKGROUND OF THE INVENTION

1. Field of the Invention

This invention relates to an improved memory cell and to a two-rail data bus line configuration by which to either read and write cell data or power the memory cell.

2. Prior Art

Conventional memory cells typically require relatively numerous bus lines as well as several large sized components in order to either access the cell for reading or writing binary information and for providing power to the cell. As a result thereof, the overall size and cost of the conventional memory cell is undesirably increased. Thus, the area consumed by an array comprised of conventional memory cells is also correspondingly increased.

What is more, in order to power an array comprised of conventional memory cells so as to refresh the logical state of each of the cell data nodes, all of the memory cells of the array are scanned individually. Therefore, the speed of operating the array is undesirably slowed. Moreover, relatively complex multiplexing means are required to both power and scan the conventional memory cells comprising the array.

SUMMARY OF THE INVENTION

Briefly, and in general terms, an improved high-speed memory cell is disclosed. The cell includes a pair of data bus line means. The bus line means are shared for the dual purpose of providing power to the memory cell during a static or holding cell condition or for reading and writing binary information during a dynamic cell condition. Clock control means are included to selectively render the cell in either of the static or dynamic conditions. The instant memory cell includes first and second data nodes. Each data node is respectively connected to one of the pair of bus lines through the conduction path of an associated coupling field effect transistor. The gate electrodes of the associated coupling field effect transistors are connected in a cross-coupled relationship with respect to one another to the opposite data node. An isolation diode is connected across the conduction path of each of the coupling field effect transistors. In a preferred embodiment, the coupling field effect transistors are fabricated from a layer of silicon on a sapphire substrate. Therefore, the isolation diode is inherently formed across the conduction path of the silicon on sapphire transistor.

The improved memory cell may be arranged in an array. Respective address select input terminals are connected to the data nodes of each cell through a load diode. A clock enabling signal is supplied to each of the address select input terminals. Each of the memory cell data nodes are connected to a source of reference potential via the data bus line means to thereby render the memory cells of the array in the static condition. The memory cells are powered, and the relative logic levels of the data nodes thereof are simultaneously refreshed.

A particular memory cell of the array is accessed by row and column address decoders for reading or writing cell data. The data bus line means are disconnected from the source of reference potential. A suitable enabling signal is selectively applied from one of the decoders to the address select input terminal of the particular memory cell. The particular cell is thereby rendered in the dynamic condition, whereat information signals are supplied via the data bus means.

DESCRIPTION OF THE PREFERRED EMBODIMENT

Figure 1:
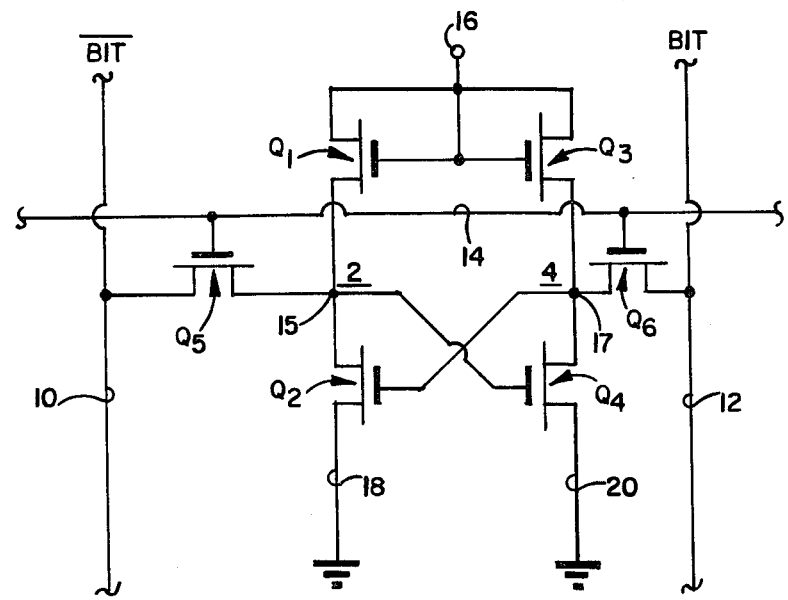
FIG. 1 shows one example of a conventional memory cell and associated bus line configuration.

Referring to FIG. 1 of the drawings, one example of a conventional memory cell is illustrated. The conventional memory cell includes a well known flip-flop circuit having a pair of cross-coupled inverter stages 2 and 4. The first cross-coupled inverter stage 2 is comprised of first and second field effect transistors $Q_1$ and $Q_2$. The second cross-coupled inverter stage 4 is comprised of third and fourth field effect transistors $Q_3$ and $Q_4$. Binary information is written into the memory cell and read out from the memory cell over a pair of data bus lines 10 and 12. A data bus line is connected to each of the cross-coupled inverter stages 2 and 4 at respective data nodes 15 and 17 through the conduction path of a coupling transistor $Q_5$ and $Q_6$. The conventional memory cell is selectively accessed by supplying a suitable signal along an address or row select bus line 14. Row select bus line 14 is connected to the control electrodes of each of the coupling transistors $Q_5$ and $Q_6$. The conventional memory cell includes a power input terminal 16. Power input terminal 16 is selectively connected to a supply of reference voltage. The conduction paths of transistors $Q_1$ and $Q_2$ are connected in a series circuit from the power input terminal 16, through data node 15 and to a second source of reference voltage (e.g. ground). The conduction paths of transistors $Q_3$ and $Q_4$ are connected in a series-circuit from power input terminal 16, through data node 17 and to the second source of reference voltage. The operation of the conventional memory cell is well known, an understanding of which does not form a part of the instant invention. One such commercially available memory cell is the 1M7552 static RAM manufactured by RCA Corporation.

The conventional memory cell typically requires six transistors $Q_1$-$Q_6$ and six bus lines. For example, the memory cell shown and described in FIG. 1 requires data bus lines 10 and 12, row select bus line 14, a power bus line (not shown) connected to power input terminal 16 and bus lines 18 and 20 which connect the conduction paths of the respective transistors forming the cross-coupled inverter stages 2 and 4 to the second source of reference voltage. As a result of the plurality of transistors and bus lines required to implement the conventional memory cell, both the memory cell and a corresponding array thereof are undesirably increased in size. Consequently, the cost of producing a memory cell array is also increased.

Figure 2:
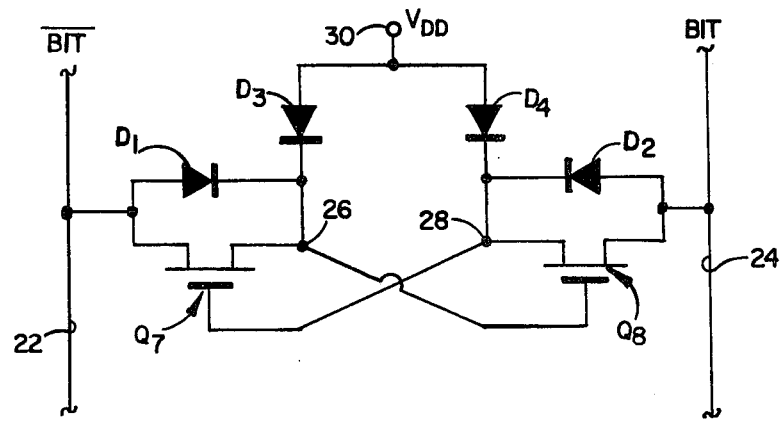
FIGS. 2 and 3 schematically show different embodiments of the improved memory cell of the instant invention and the associated two-rail bus line configuration thereof.

Referring to FIG. 2, an improved memory cell having reduced size and cost of manufacture is shown. In accordance with the instant invention, a unique two-rail bus line configuration is disclosed by which to power the memory cell during a holding or static cell condition and read and write memory cell data during a dynamic cell condition. The improved memory cell includes $\overline{BIT}$ data bus line 22 and opposite state BIT data bus line 24. The conduction path electrodes of first and second coupling transistors $Q_7$ and $Q_8$ are respectively connected between the bus lines 22 and 24 and data nodes 26 and 28. The control electrodes of transistors $Q_7$ and $Q_8$ are connected in a cross-coupled relationship with respect to one another to the opposite data node 28 and 26. Isolation diode means D1 and D2 are respectively connected across the conduction paths of transistors $Q_7$ and $Q_8$ and between bus lines 22 and 24 and data nodes 26 and 28. Load diode means $D_3$ and $D_4$ are respectively connected between an address select input terminal 30 and the data nodes 26 and 28. When the memory cell is selectively addressed and a suitable selection voltage $V_{DD}$ is applied to address select input terminal 30, diodes $D_3$ and $D_4$ are connected to be forward biased and are designed to operate as relatively large load resistors. At all other times, diodes $D_3$ and $D_4$ are reverse biased and are thereby cutoff. Typically, the selection voltage $V_{DD}$ lies in a range of between 3-15 volts.

In operation, and as will be explained in greater detail in FIG. 4, the improved memory cell of FIG. 2 is initially rendered in a static or holding condition during the time when it is not being accessed for the purpose of reading or writing binary information. Each of the bus lines 22 and 24 is connected to a source of relatively LOW reference potential, such as ground, by means to be described hereinafter.

To write data into the instant memory cell, the source of LOW reference potential is disconnected from the bus lines 22 and 24. The address select input terminal 30 is connected to receive selection voltage $V_{DD}$ from a suitable source thereof. The data bus lines 22 and 24 may then be driven so that one of the bus lines (e.g. 22) has a signal thereon representative of a relatively HI (i.e. true) logic level, and the second of the bus lines (e.g. 24) has a signal thereon representative of a relatively LOW (i.e. false) logic level. The instant memory cell is thereby rendered in a dynamic condition. A relatively HI logic level signal (corresponding to the logic level of data bus line 22) is supplied through isolation diode $D_1$, which is forward biased, to data node 26. The HI logic level signal is further supplied from data node 26 to the control or gate electrode of coupling transistor $Q_8$. The gate electrode of transistor $Q_8$ is supplied with sufficient threshold potential, and transistor $Q_8$ is thereupon rendered conductive. A relatively LOW logic level signal (corresponding to the logic level of data bus line 24) is supplied to data node 28 through the conduction path electrodes of transistor $Q_8$. Isolation diode $D_2$ is cutoff. The LOW logic level signal is further applied from data node 28 to the control or gate electrode of coupling transistor $Q_7$. The gate electrode of transistor $Q_7$ is supplied with an insufficient voltage to achieve the threshold point thereof, and transistor $Q_7$ is rendered non-conductive. To summarize the results thereof, data node 26 assumes a voltage representative of the relatively HI logic level signal applied thereto from data bus line 22 via diode $D_1$. Data node 28 is clamped through the conduction path of coupling transistor $Q_8$ and assumes a voltage representative of the relatively LOW logic level signal applied to data bus line 24.

After binary information is written into the memory cell, the cell is again rendered in the static or holding condition. Address select input terminal 30 is connected to receive the selection voltage $V_{DD}$. Data bus lines 22 and 24 are connected to the source of relatively LOW reference potential. The selection voltage, applied from input terminal 30 via a load diode (e.g. $D_3$), maintains a data node (e.g. 26) at a relatively HI logic level, inasmuch as the associated coupling transistor (e.g. $Q_7$) was rendered non-conductive, as described above. The voltage on the data node (e.g. 26) maintains the other coupling transistor (e.g. $Q_8$) conductive. The other data node (e.g. 28) is thus maintained at a relatively LOW logic level, despite the presence of associated load diode (e.g. $D_4$), which is also connected to receive the selection voltage from input terminal 30.

To read the binary information stored within a selected memory cell, the relatively LOW reference potential is disconnected from the data bus lines 22 and 24. Selection voltage $V_{DD}$ is applied to the address select input terminal 30. The data bus lines 22 and 24 may then be connected to a conventional signal sensing means (not shown). The instant memory cell is again rendered in a dynamic condition. As in the previous example, data nodes 26 and 28, respectively, have relatively HI and LOW logic level signals thereon, and coupling FETs $Q_7$ and $Q_8$ are accordingly rendered non-conductive and conductive. The voltage of BIT data bus line 24 rises toward that of selection voltage $V_{DD}$, inasmuch as a current path exits from address select input terminal 30 to data bus line 24 via forward biased diode $D_4$ and the conduction path of coupling FET $Q_8$. $\overline{BIT}$ data bus line 22 remains at a voltage approximating ground, inasmuch as FET $Q_7$ is rendered non-conductive and isolation diode $D_1$ is back biased to selection voltage $V_{DD}$. Because of the large load resistance of diode $D_4$ in the forward biased condition, coupling FET $Q_7$ is still non-conductive, as a result of an insufficient threshold potential at the gate electrode thereof. The signal sensing means receives a differential signal from data bus lines 22 and 24, which signal is indicative of the respective logic levels of data nodes 26 and 28.

Figure 3:
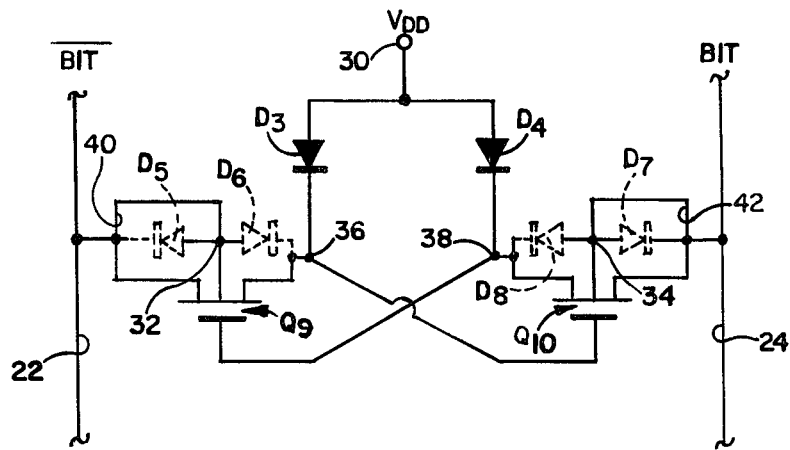

In a preferred embodiment of FIG. 3, each of the coupling transistors $Q_9$ and $Q_{10}$, respectively connected between data bus lines 22 and 24 and data nodes 36 and 38, is an n-channel metal oxide semiconductor field effect transistor (NMOSFET) fabricated from a layer of silicon on a sapphire substrate (SOS). As is common to such field effect transistors which are fabricated by silicon on sapphire techniques, a respective body node 32 and 34 is formed within the lightly doped P-region between the source and drain electrodes of the SOS coupling transistors $Q_9$ and $Q_{10}$. The substrates of each of the SOS/FETs $Q_9$ and $Q_{10}$ are respectively connected to bus lines 22 and 24 through body nodes 32 and 34. In the present embodiment, the physical presence of the isolation diodes $D_1$ and $D_2$, utilized in the embodiment of FIG. 2, is eliminated, because oppositely poled diode pairs $D_5$-$D_6$ and $D_7$-$D_8$ (shown dotted) are inherently formed between the N+ and P− regions of SOS/FETs $Q_9$ and $Q_{10}$ during the fabrication thereof. Inherently formed diodes $D_5$ and $D_7$ are inconsequential to the operation of the instant memory cell. Suitable shorting means 40 and 42 (e.g. an ohmic connection) are respectively connected thereacross and between body nodes 32 and 34 and data bus lines 22 and 24.

The operation of the memory cell disclosed in FIG. 3 is substantially the same as that described with reference to FIG. 2. The instant memory cell is initially rendered in a static or holding condition during the time that it is not being accessed for the purpose of reading or writing binary information. Each of the data bus lines 22 and 24 is connected to a source of relatively LOW reference potential in order to refresh the logic level of the memory cell data nodes. To read or write binary information, the source of relatively LOW reference potential is disconnected from data bus lines 22 and 24. The address select input terminal 30 is connected to receive selection voltage $V_{DD}$. Data bus lines 22 and 24 are either connected to signal sensing means or driving means to read or write cell data. The memory cell is thereby rendered in a dynamic condition.

However, in order to write data into the memory cell of FIG. 3, a current path (depending upon the logical state of the signals applied to the $\overline{BIT}$ and BIT bus lines) is established from the one of the bus lines 22 and 24 having thereon a relatively HI logic level signal, through shorting means 40 or 42 across the inherently formed isolation diodes $D_5$ and $D_7$ of corresponding coupling SOS/FETs $Q_9$ and $Q_{10}$, to body node 32 or 34. The current path is further established from the body node 32 or 34 to its respective data node 36 or 38 through forward biased diode $D_6$ or $D_8$. The remaining part of the write operation and the means by which binary data is read from the memory cell is identical to that described supra, with respect to the memory cell of FIG. 2.

Figure 4:
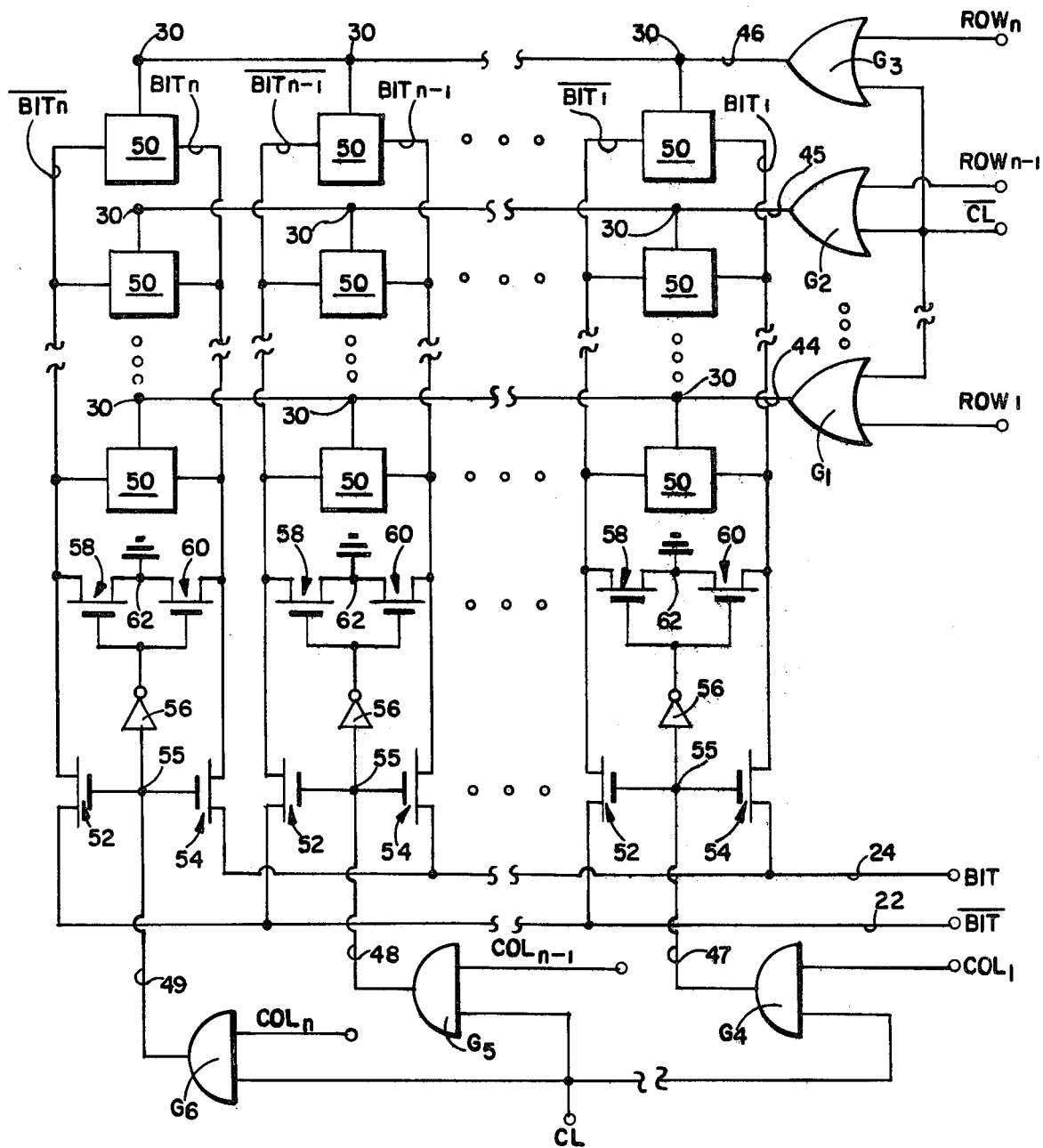
FIG. 4 shows an array comprised of the instant memory cell and the interconnection with the two rail bus line configuration for high-speed operation.

FIG. 4 shows a high-speed array formed from a plurality of the improved memory cells of either FIGS. 2 or 3. The memory cells 50 comprising the array are interconnected with a two-rail data bus line configuration which is shared for the dual purpose of reading and writing selected cell data or for providing means by which to simultaneously power the cells of the array. The number of bus lines typically associated with conventional memory cell arrays is reduced. The size and cost of the instant array are also minimized with respect to that of an array formed from conventional memory cells, such as that shown in FIG. 1.

Synchronous control of the memory cells 50 comprising the array is provided by a suitable clock signal generator (not shown). The clock signal may be a gated clock signal, including a master clock signal to activate selected memory cells 50 and a chip enable signal to activate selected chips, where a plurality thereof are utilized. A first clock signal, designated $\overline{CL}$, and respective row select enabling signals $ROW_1$ - $ROW_n$ are supplied to input terminal means of OR gates $G_1$-$G_3$. Row select signals $ROW_1$ - $ROW_n$ are provided by a well known row address decoder (not shown). The row address decoder is programmed to supply a suitable enabling signal to the input terminal means of that OR gate $G_1$ - $G_3$ which is connected to the row line 44-46 having the particular memory cell to be selectively accessed for information. Row lines 44-46 are respectively connected from output terminal means of OR gates $G_1$ - $G_3$ to the address select input terminal 30 of each of the memory cells 50.

Figure 5:
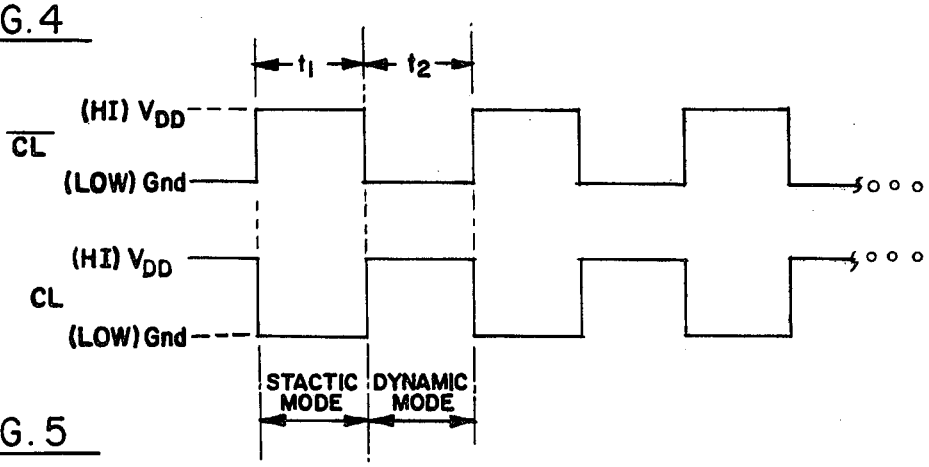
FIG. 5 shows waveforms representative of clock control signals provided to synchronously control operation of the memory cells comprising the array of FIG. 4.

A second clock signal, designated CL, and respective column select signals $COL_1$-$COL_n$ are supplied to input terminal means of AND gates $G_4$-$G_6$. Column select signals $COL_1$-$COL_n$ are provided by a suitable means, such as a column address decoder (not shown). The column address decoder is programmed to supply a suitable enabling signal to the input terminal means of that AND gate $G_4$-$G_6$ which is connected to the column line 47-49 having the particular memory cell to be selectively accessed for information. The first and second clock signals $\overline{CL}$ and CL, illustrated in FIG. 5, provide HI and LOW logic level signals having opposite polarities with respect to one another. Column lines 47-49 are respectively connected from output terminal means of AND gates $G_4$-$G_6$ to the input terminal of an inverter gate 56. The input terminal of each inverter gate 56 is respectively connected to the gate electrode of a first pair of control field effect transistors 52 and 54 through a common electrical junction 55. The conduction path electrodes of FETs 52 and 54 are respectively connected in series with one of the $\overline{BIT}_1$ - $\overline{BIT}_n$ and $BIT_1$ - $BIT_n$ data bus lines. The output terminal of each of the inverter gates 56 is respectively connected to the gate electrode of a second pair of control field effect transistors 58 and 60. The conduction path electrodes of FETs 58 and 60 are connected in series between respective pairs of data bus lines $\overline{BIT}_1$ - $\overline{BIT}_n$ and $BIT_1$ - $BIT_n$. The series connected conduction paths of FETs 58 and 60 are connected to a source of reference potential, such as ground, through a common electrical junction 62.

The clock signal generator supplies relatively HI $\overline{CL}$ and LOW CL clock input signals to the input terminal means of logic gates $G_1$-$G_3$ and $G_4$-$G_6$, respectively, during a first interval $t_1$ of the clock cycle. A HI logic level selection signal is applied to each of the address select input terminals 30 of the cells 50 comprising the array. The presence of a relatively HI $\overline{CL}$ clock signal at the input terminal means of OR gates $G_1$-$G_3$ is sufficient to clamp the signal at the output terminal means of OR gates $G_1$-$G_3$ to a relatively HI logic level selection signal for the duration of the $t_1$ clock interval. During the same clock interval $t_1$, each of the column select lines 47-49 is supplied with a relatively LOW logic level input control signal. The presence of both a relatively HI column select signal $COL_1$-$COL_n$ and CL clock signal are required at the input terminal means of AND gates $G_4$-$G_6$ in order to cause the signal at the output terminal means thereof to be relatively HI. The CL clock signal is otherwise relatively LOW for the duration of the $t_1$ clock interval.

The relatively LOW level input control signal is supplied from the output terminal means of AND gates $G_4$-$G_6$ to the input terminal of inverter gates 56 and to the gate electrodes of each of the first pair of control FETs 52 and 54 through common electrical junction 55. FETs 52 and 54 are, thereby, rendered non-conductive. The logic level of the control signal is inverted at the output terminal of inverter gates 56. Thus, a relatively HI logic level control signal is applied to the gate electrodes of each of the second pair of control FETs 58 and 60. FETs 58 and 60 are, thereby, rendered conductive. Each of the pairs of $\overline{BIT}_1$ - $\overline{BIT}_n$ and $BIT_1$ -$BIT_n$ data bus lines is connected to ground through the respective conduction paths of FETs 58 and 60 and common electrical junction 62. Hence, one of the data nodes of each of the improved memory cells of FIGS. 2 or 3 having a relatively LOW logic level is connected through the conduction path of a conductive coupling FET to ground via the respective data bus line. The memory cells 50 are rendered in a static or holding condition during the $t_1$ clock interval. Power is simultaneously supplied to the address select input terminal 30 of each of the memory cells of the array, and the relatively HI logic level of the second data nodes of each of the memory cells is refreshed via one of the load diodes (D₃ or D₄).

The clock signal generator supplies relatively HI $\overline{CL}$ and LOW CL clock signals to the input terminal means of logic gates $G_4$-$G_6$ and $G_1$-$G_3$, respectively, during a second interval $t_2$ of the clock cycle. A particular memory cell from the array can be selectively accessed for reading and writing binary information. The column address decoder causes one relatively HI logic level column select enabling signal $COL_1$-$COL_n$ to be supplied to the input terminal means of the one AND gate $G_4$-$G_6$ connected to the corresponding column select line 47-49 having the particular memory cell 50 to be selected. The presence of two relatively HI logic level signals (i.e. the one $COL_1$-$COL_n$ enabling signal and the $\overline{CL}$ clock signal) at the input terminal means of the one AND gate $G_4$-$G_6$ causes the signal at the output terminal means thereof to be relatively HI for the duration of the $t_2$ clock interval. Hence, the one corresponding column select line 47-49, connected to the output terminal means of the one AND gate $G_4$-$G_7$ is supplied with a relatively HI logic level input control signal. The HI logic level input control signal is applied to the input terminal of the respectively connected inverter gate 56 and to the gate electrodes of each of the first pair of FETs 52 and 54 through common electrical junction 55. FETs 52 and 54 are, thereby, rendered conductive. The logic level of the relatively HI input control signal is inverted at the output terminal of inverter gate 56. A relatively LOW logic level control signal is applied to the gate electrodes of each of the second pair of FETs 58 and 60. FETs 58 and 60 are, thereby, rendered nonconductive. Thus, the selected pair of $\overline{BIT}_1$-$\overline{BIT}_n$ and $BIT_1$-$BIT_n$ data bus lines is disconnected from the source of reference potential (ground) and is connected to bus lines 22 and 24 through the respective conduction paths of FETs 52 and 54.

The respective output terminal means of those AND gates $G_4$-$G_6$ not receiving the one relatively HI column select enabling signal $COL_1$-$COL_n$ at the input terminal means thereof are clamped relatively LOW for the duration of the $t_2$ clock interval. The $\overline{BIT}_1$-$\overline{BIT}_n$ and $BIT_1$-$BIT_n$ data bus line pairs of those columns of memory cells 50 not receiving the one relatively HI logic level input control signal from the output terminal means of the one AND gate $G_4$-$G_6$ remain clamped to ground, as previously described. The memory cells 50 connected between the pairs of unselected bus lines remain in the static or holding condition.

The row address decoder causes one relatively HI logic level row select enabling signal $ROW_1$-$ROW_n$ to be supplied to the input terminal means of the one OR gate $G_1$-$G_3$ connected to the corresponding row line 44-46 having the particular memory cell 50 to be accessed. The presence of the one relatively HI row select signal $ROW_1$-$ROW_n$ at the input terminal means of the one OR gate $G_1$-$G_3$ is sufficient to clamp the output terminal means thereof to a relatively HI logic level selection signal for the duration of the $t_2$ clock interval. The HI logic level selection signal is applied from the output terminal means of the one OR gate $G_1$-$G_3$ to the one corresponding row select line 44-46 connected thereto. The respective signals at the output terminal means of those OR gates $G_1$-$G_3$ not receiving the one relatively HI address select enabling signal $ROW_1$-$ROW_n$ at the input terminal means thereof are relatively LOW for the duration of the $t_2$ clock interval, inasmuch as the logic level of the CL clock signal is also relatively LOW during the $t_2$ interval.

Each of the address select input terminals 30 of the memory cells 50 connected to the one corresponding row select line 44-46 is supplied with the relatively HI logic level selection signal. Only one particular memory cell location from the array thereof receives both relatively HI column and row address enabling signals. Thus, the particular memory cell is connected to data bus lines 22 and 24 and input terminal 30 so as to be selectively rendered in the dynamic condition during the $t_2$ clock interval. The selected cell 50 is thereby accessed for the purpose of reading or writing binary information in a manner previously described. The logic level of the data nodes comprising the selected memory cell may be sensed by a differential amplifier (not shown) connected to bus lines 22 and 24. The logic level of the data nodes comprising the selected memory cell may otherwise be set by respectively driving the $\overline{BIT}$ and BIT data bus lines 22 and 24 to either of the two complementary binary states, as is desirable.

It will be apparent, that while a preferred embodiment of the invention has been shown and described, various modifications and changes may be made without departing from the true spirit and scope of the invention. For example, while devices $Q_7$-$Q_{10}$ are described as n-channel field effect transistors, any other suitable semiconductor device is contemplated herein. Moreover, while devices $Q_9$ and $Q_{10}$ are described as being field effect transistors fabricated from a layer of silicon on a sapphire substrate, devices $Q_9$ and $Q_{10}$ may be fabricated from any suitable semiconductor material on an insulating substrate. As will be understood by those skilled in the art, the conducting modes of FETs $Q_7$-$Q_{10}$ and the corresponding logic levels of data nodes 26, 28, 36 and 38 are dependent upon the type of device employed and the logic level of the information signals applied to the data bus lines 22 and 24.

Having set forth a preferred embodiment of the invention, what is claimed is:

1. A memory cell comprising a flip-flop having first and second data bus line means by which to read and write cell data, said memory cell including:
    first and second data node means for receiving and storing memory cell data,
    first and second multi-terminal semiconductor coupling devices, each of said coupling devices having a pair of conduction path terminals respectively connected between one of said data node means and a corresponding one of said first and second data bus line means, and
    first unidirectional current conducting means respectively connected across the conduction path terminals of each of said first and second coupling devices.

2. The memory cell recited in claim 1, wherein said first unidirectional current conducting means includes a diode.

3. The memory cell recited in claim 1, including terminal means to receive a signal thereat to selectively address said memory cell, and
    second unidirectional current conducting means respectively connected between said terminal means and each of said first and second data node means.

4. The memory cell recited in claim 3, wherein said second unidirectional current conducting means includes a diode.

5. The memory cell recited in claim 1, wherein each of said first and second multi-terminal semiconductor coupling devices is a field effect transistor fabricated from a layer of silicon deposited on a sapphire substrate.

6. In combination:
source means for providing a plurality of reference potentials,
bus line means,
switching means to selectively connect said bus line means to said source means to receive a first of said reference potentials,
memory cell means including a terminal connected to said source means to receive a second of said reference potentials to address said memory cell means, said memory cell means also having;
data node means for receiving an information signal,
coupling means having first and second conduction path electrodes to selectively connect said data node means to said bus line means,
first unidirectional current conducting means connected between said data node means and said bus line means and across the conduction path electrodes of said coupling means, and
second unidirectional current conducting means connecting said terminal to said data node means to refresh the logical condition of the information signal of said data node means.

7. The combination recited in claim 6, wherein said first and second unidirectional current conducting means each include a diode.

8. The combination recited in claim 6, wherein said coupling means to selectively connect said data node means to said bus line means includes a field effect transistor formed from a layer of silicon deposited on a sapphite substrate,
said field effect transistor having a pair of oppositely poled unidirectional current conducting devices connected across the conduction path thereof, and
shorting means connected across one of said oppositely poled unidirectional current conducting devices.

9. The memory cell recited in claim 1, wherein said first unidirectional current conducting means includes a pair of series connected, oppositely poled diodes connected across the respective conduction path terminals of each of said first and second semiconductor coupling devices and between said data node means and said corresponding bus line means.

10. The memory cell recited in claim 9, including shorting means connected across one of said oppositely poled diodes.

11. The memory cell recited in claim 1, including transistor means to selectively connect each of said first and second data bus line means to a reference potential source means.

12. A high-speed memory cell array comprising:
a plurality of memory cell means having at least two modes of operation, each of said memory cell means including respective data node means to receive an information signal and address terminal means connected to said data node means,
reference potential source means,
bus line means connected to said memory cell means data node means,
first transistor means enabled during a first time interval to simultaneously connect each of said bus line means to said reference potential source means during a static mode of operation whereby the logical condition of the information signal of each of said memory cell means data node means is refreshed and second transistor means enabled during a second time interval to connect the data node means of a selected one of said plurality of memory cell means to said bus line means during a dynamic mode of operation for reading or writing the logical condition of the information signal of said selected memory cell means,
control circuitry connected to control electrodes of each of said first and second transistor means to regulate the conductivity thereof, said control circuitry also connected to provide power to the respective address terminal means of each of said plurality of memory cell means during the static mode of operation and to the selected one of said memory cell means during the dynamic mode of operation, wherein said control circuitry also includes timing means to simultaneously regulate the conductivity of said first and second transistor means during said first and second time intervals, the control electrodes of said first and second transistor means receiving respective control signals that are inverted with respect to one another.

13. The high-speed memory array recited in claim 12, wherein said first transistor means is connected between said bus line means and said reference potential source means and said second transistor means is connected in electrical series with said bus line means.

* * * * *